(12) United States Patent
Lee et al.

(10) Patent No.: US 7,176,084 B2
(45) Date of Patent: Feb. 13, 2007

(54) SELF-ALIGNED CONDUCTIVE SPACER PROCESS FOR SIDEWALL CONTROL GATE OF HIGH-SPEED RANDOM ACCESS MEMORY

(75) Inventors: Tzyh-Cheang Lee, Hsinchu (TW); Fu-Liang Yang, Hsinchu (TW); Jiunn-Ren Hwang, Hsinchu (TW); Tsung-Lin Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/148,342

(22) Filed: Jun. 9, 2005

(65) Prior Publication Data

US 2006/0281254 A1    Dec. 14, 2006

(51) Int. Cl.
*H01L 21/336* (2006.01)
*H01L 21/8234* (2006.01)
*H01L 21/8238* (2006.01)
*H01L 21/4763* (2006.01)
*H01L 21/3205* (2006.01)
*H01L 21/461* (2006.01)
*H01L 21/302* (2006.01)

(52) U.S. Cl. .................. 438/257; 438/258; 438/259; 438/201; 438/211; 438/216; 438/261; 438/593; 438/596; 438/740; 438/742; 257/E21.626

(58) Field of Classification Search ........ 438/257–259, 438/201, 211, 216, 261, 593, 596, 740, 742; 257/315–321, 332
See application file for complete search history.

(56) References Cited

U.S. PATENT DOCUMENTS 6,570,213 B1 *   5/2003   Wu ............................. 257/315
6,689,658 B2 *   2/2004   Wu ............................. 438/257

* cited by examiner

*Primary Examiner*—Michael Lebentritt
*Assistant Examiner*—Mohsen Ahmadi
(74) *Attorney, Agent, or Firm*—Birch, Stewart, Kolasch & Birch, LLP

(57) ABSTRACT

A self-aligned conductive spacer process for fabricating sidewall control gates on both sides of a floating gate for high-speed RAM applications, which can well define dimensions and profiles of the sidewall control gates. A conductive layer is formed on the dielectric layer to cover a floating gate patterned on a semiconductor substrate. Oxide spacer are formed on the conductive layer adjacent to the sidewalls of the floating gate. Performing an anisotropic etch process on the conductive layer and using the oxide spacers as a hard mask, a conductive spacers are self-aligned fabricated at both sides of the floating gate, serving as sidewall control gates.

18 Claims, 4 Drawing Sheets

SELF-ALIGNED CONDUCTIVE SPACER PROCESS FOR SIDEWALL CONTROL GATE OF HIGH-SPEED RANDOM ACCESS MEMORY

TECHNICAL FIELD

The present invention relates to high-speed random access memory (RAM) applications, and particularly to a self-aligned conductive spacer process for fabrication sidewall control gates.

BACKGROUND

The demands for highly efficient digital equipment continue to increase, and there is strong need to embed high-speed and low-power-consumption memory into SoC (system-on-chip). Since conventional memories such as SRAM, DRAM, and flash are unsuitable choices for these applications, one unique memory, Direct Tunneling Memory (DTM), with ultra-thin tunnel oxide and novel depleted floating gate is developed for cost-effective and scalable embedded RAM applications. The features of the DTM structure include sidewall control gates fabricated on both sides of a floating gate, and offset source/drain regions without overlapping the floating gate. Its simple fabrication process is fully compatible with the existing CMOS logic technology, and its simple structure can obtain sufficient tunnel current at higher speed operation and lower operating voltage than conventional flash memory.

FIG. 1 is a cross-sectional diagram illustrating a high-speed RAM with sidewall control gates fabricated by a conventional polysilicon spacer process. In general, a gate oxide layer 12, a first polysilicon layer 14 and a hard mask layer 16 are successively deposited on a semiconductor substrate 10, and then the first polysilicon layer 14 is patterned to form a floating gate 14 from the use of photolithography and etching process. Next, a thin silicon oxide layer 18 is thermally grown on the substrate 10 and sidewalls of the floating gate 14. Then a second polysilicon layer 20 is deposited followed by an anisotropic etch-back process, which forms sidewall control gates 20 on both sides of the floating gate 14. The thin oxide layer 18 is also etched through, leaving this thin oxide layer 18 only underlying the sidewall control gates 20.

The conventional anisotropic polysilicon etch process, however, can not well control the dimensions and profiles of the sidewall control gates to facilitate proper device design. The width of polysilicon spacer, referred to the control gate width, may vary to a large extent in a wafer or from wafer to wafer. The variation in the spacer width is also unfavorable to subsequent contact process, and therefore an additional polysilicon line is needed for the contact formation, which leads to increase in memory cell size and difficulty in layout design. Moreover, the anisotropic etch back may round corners of the polysilicon spacers, thus a subsequent silicidation process, for reducing the RC time constant and improving operations of reading, programming, and erasing, can not be perfectly performed in the rounded-shaped control gates.

SUMMARY OF THE INVENTION

Embodiments of the present invention include a self-aligned conductive spacer process for fabricating sidewall control gates on both sides of a floating gate for high-speed RAM applications, which can well define dimensions and profiles of the sidewall control gates.

In one aspect, the present invention provides a conductive spacer process including the following steps. A floating gate is formed on a semiconductor substrate, and a dielectric layer is then formed on the semiconductor substrate to cover sidewalls of the floating gate. A conductive layer is formed on the dielectric layer, and then an oxide spacer is formed on the conductive layer and located adjacent to the sidewalls of the floating gate. Performing an anisotropic etch process on the conductive layer and using the oxide spacer as a hard mask, a conductive spacer is formed adjacent to the sidewalls of the floating gate, serving as a sidewall control gate.

In another aspect, the present invention provides a conductive spacer process including the following steps. A semiconductor substrate is provided with a stack structure of a first dielectric layer, a floating gate and a hard mask layer formed thereon. A second dielectric layer is formed on the semiconductor substrate to cover sidewalls of the floating gate. A conductive layer is formed on the second dielectric layer and the stack structure, and then an oxide layer is formed on the conductive layer. Performing a first anisotropic etch process on the oxide layer, an oxide spacer is formed adjacent to the sidewalls of the floating gate. Performing a second anisotropic etch process and using the oxide spacer as a sidewall hard mask, a conductive spacer is formed adjacent to the sidewalls of the floating gate to serves as a sidewall control gate.

In another aspect, the present invention provides an random access memory comprises a floating gate formed on a semiconductor substrate; a dielectric layer formed on the semiconductor substrate to cover sidewalls of the floating gate; two control gates formed on the dielectric layer and located at two sides of the floating gate respectively; and two oxide spacers formed on sidewalls of the control gates respectively, wherein the profile of the combination of the control gate and the oxide spacer at one side of the floating gate is substantially oblong.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF ILLUSTRATIVE EMBODIMENTS

Figure 1:
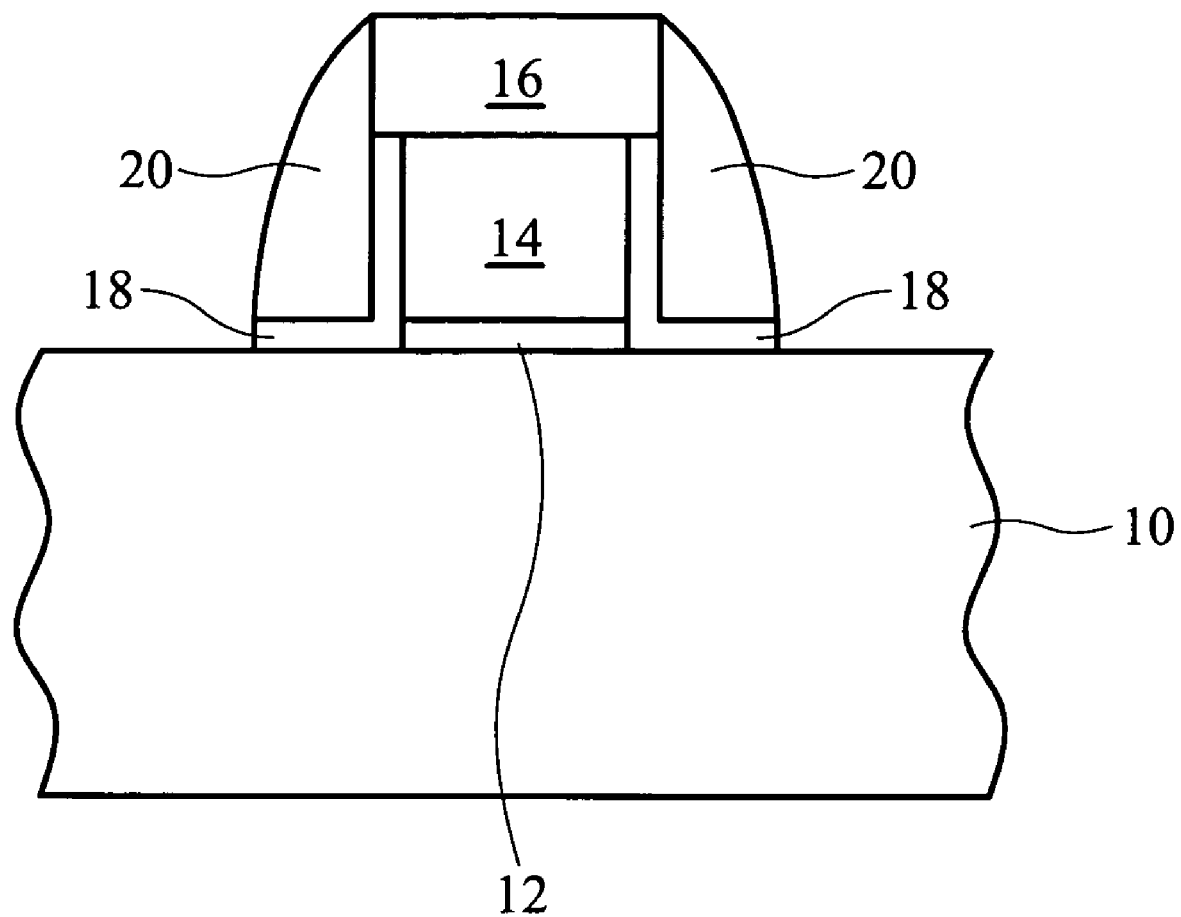
FIG. 1 is a cross-sectional diagram illustrating a high-speed RAM with sidewall control gates fabricated by a conventional polysilicon spacer process.

Embodiments of the present invention provide a self-aligned conductive spacer process to fabricate sidewall control gates on both sides of a floating gate for high-speed RAM applications, which can well define dimensions and profiles of the conductive spacers to form the control gates of an uniform width in a wafer or from wafer to wafer. Thus in subsequent processes, borderless contact formation and silicide formation can be well performed on the self-aligned control gates. Particularly, embodiments of the present invention provide a self-aligned polysilicon spacer process using a polyoxide spacer as an etch back mask to well define the width, thickness and shape of the sidewall control gate.

Embodiments of the self-aligned conductive spacer process are simple and fully compatible with the existing CMOS logic technology.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Figure 2A:
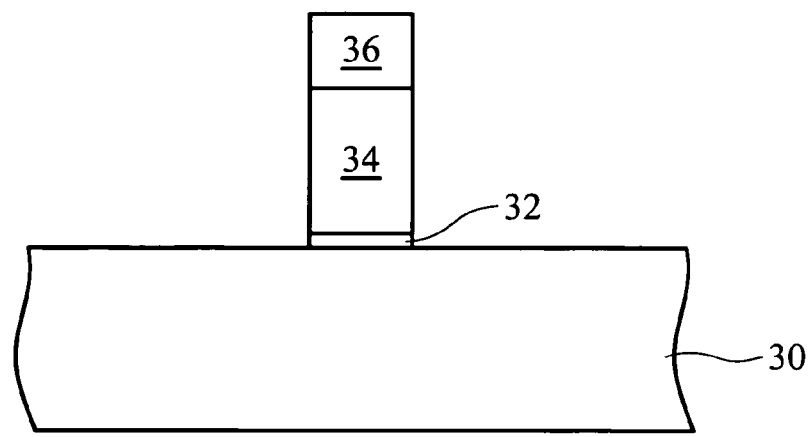
FIG. 2A to FIG. 2F are cross-sectional diagrams illustrating an exemplary embodiment of a self-aligned conductive spacer process for fabricating sidewall control gates.

Herein, cross-sectional diagrams of FIG. 2A to FIG. 2F illustrate an exemplary embodiment of a self-aligned conductive spacer process for fabricating sidewall control gates. In FIG. 2A, an example of a substrate 30 may comprise an elementary semiconductor such as silicon, germanium, or a compound semiconductor. The substrate 30 may include an epitaxial layer overlying a bulk semiconductor, a silicon germanium layer overlying a bulk silicon, a silicon layer overlying a bulk silicon germanium, or a semiconductor-on-insulator (SOI) structure. The substrate 30 may comprise an isolation feature to separate different devices formed thereon. The isolation feature may comprise different structure and can be formed using different processing technologies. For example, the isolation feature may comprise a dielectric isolation such as local oxidation of silicon (LOCOS), shallow trench isolation (STI), junction isolation, field isolation, and/or other suitable isolation structures. A first dielectric material, a first gate material and a hard mask material are successively deposited on an active area of the substrate 30, and then those stacked layers are patterned to form a first dielectric layer 32, a floating gate layer 34 and a hard mask layer 36. The patterning step may be accomplished using photolithography and etching to transfer the pattern defined by a photomask to the deposited materials. The photolithography process may include photoresist coating, soft baking, mask aligning, exposing, post-exposure baking, developing photoresist, hard baking, and photoresist stripping. The etching process may include wet etch, dry etch, ion-reactive-etch (RIE), and other suitable processing.

The first dielectric layer 32 may comprises a silicon oxide layer, referred to a tunnel oxide, which may be formed through a thermal oxidation process or a chemical vapor deposition (CVD) process. The first dielectric layer 32 is also to be appreciated other well-known dielectric material such as nitrides, oxynitride, high-k materials, any other non-conductive materials, and combinations thereof. The floating gate layer 34 may comprise a polysilicon layer formed through, for example Low Pressure CVD (LPCVD) methods, CVD methods and Physical Vapor Deposition (PVD) sputtering methods employing suitable silicon source materials. If desired the polysilicon layer may be ion implanted to the desired conductive type. It is to be appreciated other well-known gate electrode material such as metal, metal alloys, single crystalline silicon, or any combinations thereof. The hard mask layer 36, which acts as a bottom anti-reflective layer underneath the photoresist and protects the floating gate layer 34 from damages in subsequent etching and implanting, may comprise a silicon oxide layer, a silicon nitride layer, an oxynitride layer, or combinations thereof formed by a method such as chemical vapor deposition (CVD), physical vapor deposition (PVD), or atomic layer deposition (ALD).

Figure 2B:
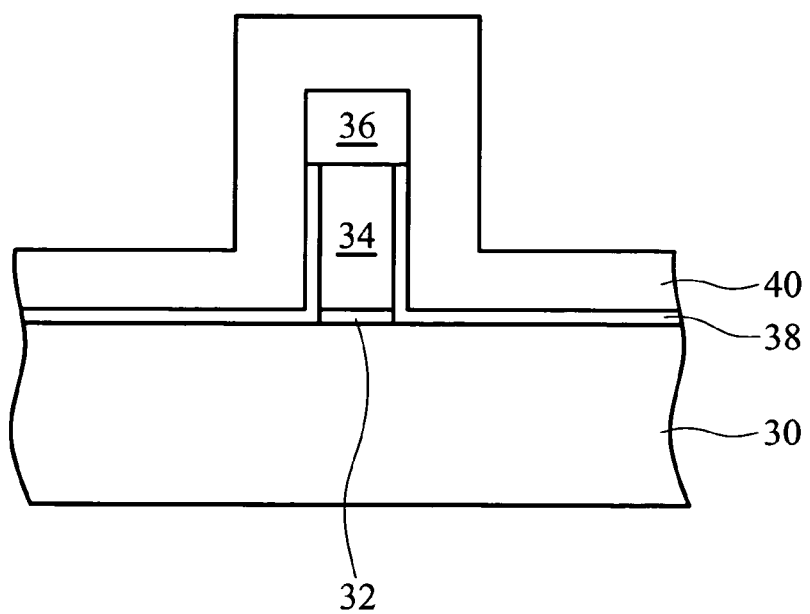

In FIG. 2B, a second dielectric layer 38 and a second gate material layer 40 are successively formed on the patterned structure as depicted in FIG. 2A. The second dielectric layer 38 is formed along sidewalls of the floating gate 34 in order to insulate the floating gate layer 34 from the second gate material layer 40. In some embodiments, the second dielectric layer 38 may comprise a silicon oxide layer grown on the surfaces of the floating gate layer 34 and the substrate 30 through a thermal oxidation process. It is to be appreciated other non-conductive material to form the dielectric layer 38 through CVD methods. The second gate material layer 40 may comprise a polysilicon layer formed through, for example Low Pressure CVD (LPCVD) methods, CVD methods and Physical Vapor Deposition (PVD) sputtering methods employing suitable silicon source materials. If desired the polysilicon layer may be ion implanted to the desired conductive type. Other well-known gate electrode material such as metal, metal alloys, single crystalline silicon, or any combinations thereof, is also appreciated to form the second gate material layer 40.

Figure 2C:
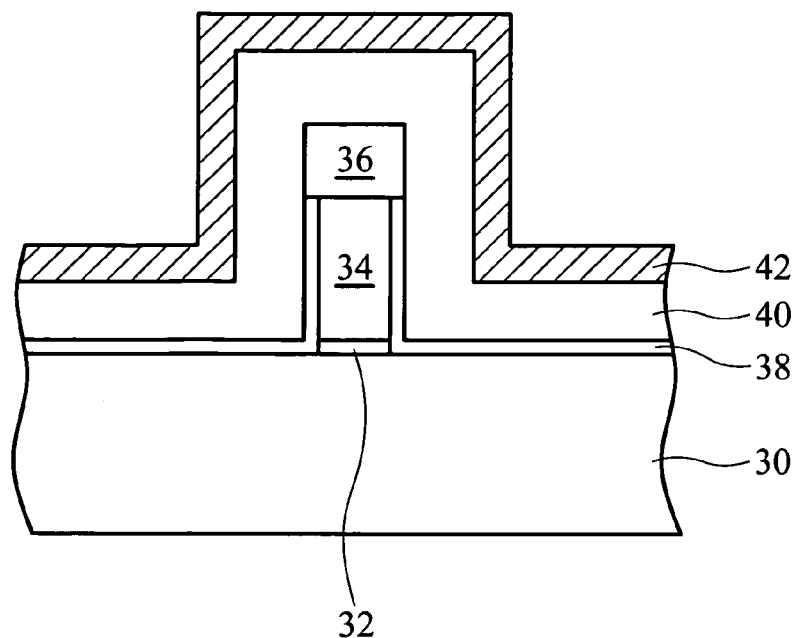

In FIG. 2C, an oxide layer 42 is formed on the second gate material layer 40 through methods including, but not limited to, thermal, rapid thermal oxidation (RTO), chemical vapor deposition (CVD) or other advanced oxide-grown technology. In some embodiments, as the second gate material layer 40 is a polysilicon layer, the exposed polysilicon is oxidized using wet-oxidation at a temperature between about 800 to 100° C., resulting in a polyoxide layer. This polysilicon re-oxidation process can thin down the second gate material layer 40, and provide the polyoxide layer as a sidewall hard mask for defining sidewall control gates in subsequent etch back process. The oxide layer 42 preferably has a thickness between about 1100 to 1300 Angstroms.

Figure 2D:
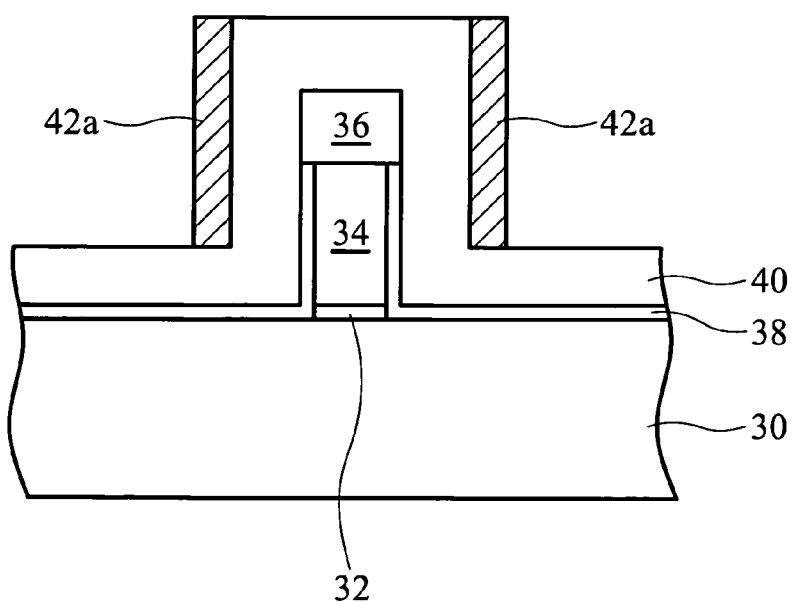

In FIG. 2D, the oxide layer 42 is etched back to expose the second gate material layer 40, leaving oxide spacers 42a only on sidewalls of the second gate material layer 40. In detail, certain regions (horizontal portions) of the oxide layer 42 are etched and stopped on the second gate material layer 40 to form the oxide spacers 42a along the vertical portions of the second gate material layer 40. The etch back process may use anisotropic etch process, such as dry etch, RIE (Reactive Ion Etching), or other plasma etching processes.

Figure 2E:
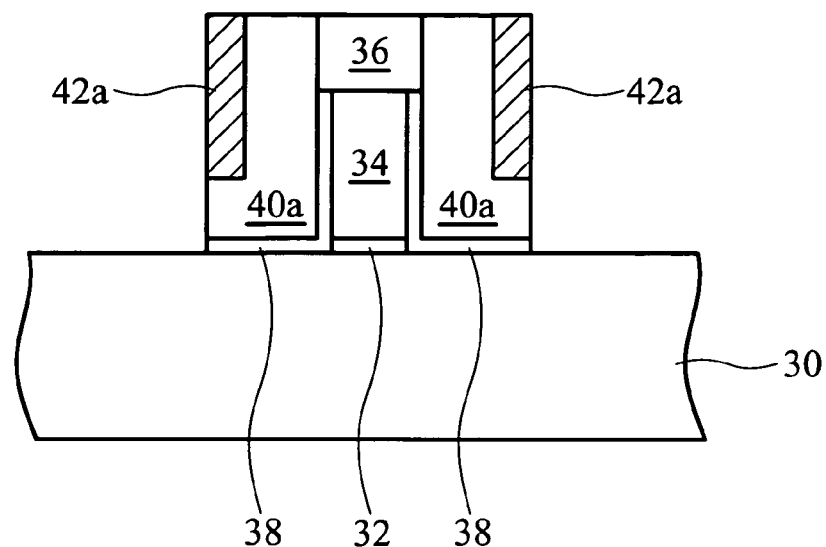

In FIG. 2E, the second gate material layer 40 is etched back through an anisotropic etch process to expose the hard mask layer 36 and the substrate 30, leaving the oxide spacers 42a and the conductive spacers 40a along sidewalls of the floating gate layer 34. The second dielectric layer 38 is also etched through, leaving this second dielectric layer 38 only underlying the conductive spacers 40a. The conductive spacers 40a therefore act sidewall control gates 40a isolated from the floating gate layer 34 by the second dielectric layer 38 for high-speed RAM applications. The profile of the conductive spacer 40a may be an L-like shape at one side of the floating gate layer 34. The profile of the combination of the conductive spacer 40a and the oxide spacer 42a at one side of the floating gate 34 may be substantially rectangular. In detail, using the oxide spacers 42a as the sidewall hard mask, certain regions (horizontal portions) of the second gate material layer 40 are etched, and portions of the oxide spacers 42a and the second dielectric layer 38 are also removed till the hard mask layer 36 and the substrate 30 are exposed. The etch back process may use dry etch, RIE (Reactive Ion Etching), or other plasma etching processes.

In the self-aligned conductive spacer process, the oxide spacers 42a used as the sidewall hard mask for the conductive spacer 40a, can well define the width and profile of the conductive spacers 40a to form the control gates 40a of a uniform width in a wafer or from wafer to wafer. Also, the self-aligned conductive spacer process can form the sidewall control gate 40a with a flat top, without rounded corners, thus borderless contact formation and silicide formation can be well performed in subsequent processes.

Figure 2F:
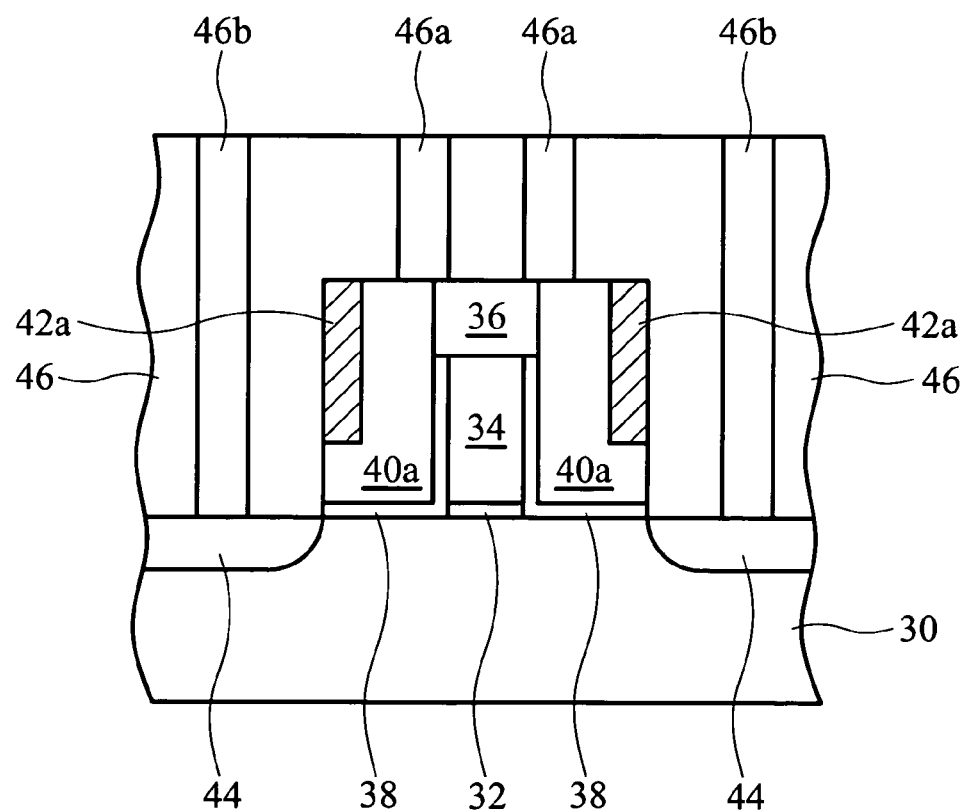

FIG. 2F illustrates the borderless contact formation on the sidewall control gates 40a. A source/drain ion implantation process is performed to implant various dopant species into the semiconductor substrate 30, resulting in source/drain regions 44 laterally adjacent to the sidewall control gates 40a respectively. An inter-layer-dielectric (ELD) layer 46 is deposited on the substrate 30, and then a contact process is performed in the ILD layer 46 to form borderless contact 46a on the sidewall control gates 40a and source/drain contacts 46b on the source/drain regions 44. Since the inventive self-aligned conductive spacer process forms the sidewall control gates 40a with flat tops, the contact formation can be borderless on the sidewall control gates 40a, thus saving an extra polysilicon line employed in conventional method.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A conductive spacer process of forming sidewall control gates, comprising:
   forming a floating gate on a semiconductor substrate;
   forming a dielectric layer on said semiconductor substrate, at least covering sidewalls of said floating gate;
   forming a conductive layer on said dielectric layer;
   forming an oxide spacer on said conductive layer and adjacent to said sidewalls of said floating gate; and
   performing an anisotropic etch process on said conductive layer and using said oxide spacer as a hard mask to form conductive spacers at both sides of said floating gate, wherein said conductive spacer serves as a sidewall control gate and is separated from said floating gate by said dielectric layer
   wherein the step of forming said oxide spacer comprises:
   forming an oxide layer on said conductive layer; and
   performing an anisotropic etch process to remove horizontal portions of said oxide layer and expose said conductive layer, leaving vertical portions of said oxide layer adjacent to said sidewalls of said floating gate.

2. The conductive spacer process of claim 1, wherein said oxide layer is grown on said conductive layer through a thermal oxidation method.

3. The conductive spacer process of claim 2, wherein said conductive layer is a polysilicon layer.

4. The conductive spacer process of claim 1, wherein the step of performing an anisotropic etch process and using said oxide spacer as a hard mask comprises:
   removing horizontal portions of said conductive layer and top portions of said oxide spacer to expose said semiconductor substrate, forming said conductive spacer with a substantially flat top.

5. The conductive spacer process of claim 4, wherein the profile of said conductive spacer is an L-like shape.

6. The conductive spacer process of claim 5, wherein the profile of the combination of said conductive spacer and said oxide spacer at one side of said floating gate is substantially rectangular.

7. The conductive spacer process of claim 1, wherein said dielectric layer is a silicon oxide layer grown on sidewalls of said floating gate through a thermal oxidation process.

8. The conductive spacer process of claim 1, further comprising forming a borderless contact on said sidewall control gate.

9. A conductive spacer process of forming sidewall control gates, comprising:
   providing a semiconductor substrate comprising a stack structure of a first dielectric layer, a floating gate and a hard mask layer formed thereon;
   forming a second dielectric layer on said semiconductor substrate, at least covering sidewalls of said floating gate;
   forming a conductive layer on said second dielectric layer and said stack structure;
   forming an oxide layer on said conductive layer;
   performing a first anisotropic etch process on said oxide layer to form oxide spacers and expose said conductive layer, wherein said oxide spacers are adjacent to said sidewalls of said floating gate; and
   performing a second anisotropic etch process and using said oxide spacers as a sidewall hard mask to form conductive spacers and expose said semiconductor substrate, wherein said conductive spacers are formed at both sides of said floating gate to serves as sidewall control gates and wherein the second ansiotropic etch process also comprises removing horizontal portions of said conductive layer and top portions of said oxide spacer to expose said semiconductor substrate, forming said conductive spacer with a substantially flat top.

10. The conductive spacer process of claim 9, wherein said oxide layer is grown on said conductive layer through a thermal oxidation method.

11. The conductive spacer process of claim 10, wherein said conductive layer is a polysilicon layer.

12. The conductive spacer process of claim 9, wherein the profile of said conductive spacer at one side of said floating gate is an L-like shape.

13. The conductive spacer process of claim 9 wherein the profile of the combination of said conductive spacer and said oxide spacer at one side of said floating gate is substantially rectangular.

14. The conductive spacer process of claim 9, wherein said dielectric layer is a silicon oxide layer grown on said floating gate and said semiconductor substrate through a thermal oxidation process.

15. The conductive spacer process of claim 9, further comprising forming a borderless contact on said sidewall control gate.

16. A conductive spacer process of forming sidewall control gates, comprising:
   forming a floating gate on a semiconductor substrate;
   forming a dielectric layer on said semiconductor substrate, at least covering sidewalls of said floating gate;
   forming a conductive layer on said dielectric layer;
   forming an oxide spacer on said conductive layer and adjacent to said sidewalls of said floating gate; and
   performing an anisotropic etch process on said conductive layer and using said oxide spacer as a hard mask to form conductive spacers at both sides of said floating gate, wherein said conductive spacer serves, wherein the step of performing an anisotropic etch process and using said oxide spacer as a hard mask comprises removing horizontal portions of said conductive layer and top portions of said oxide spacer to expose said semiconductor substrate, forming said conductive spacer with a substantially flat top.

17. The conductive spacer process of claim 16, wherein the profile of said conductive spacer is an L-like shape.

18. The conductive spacer process of claim 17, wherein the profile of the combination of said conductive spacer and said oxide spacer at one side of said floating gate is substantially rectangular.

* * * * *